(12) United States Patent
Nishimura

(10) Patent No.: US 7,408,402 B2
(45) Date of Patent: Aug. 5, 2008

(54) OPERATIONAL AMPLIFIER WITH LESS OFFSET VOLTAGE

(75) Inventor: Kouichi Nishimura, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 98 days.

(21) Appl. No.: 11/432,526

(22) Filed: May 12, 2006

(65) Prior Publication Data

US 2006/0255856 A1    Nov. 16, 2006

(30) Foreign Application Priority Data

May 16, 2005    (JP)    ............... 2005-143263

(51) Int. Cl.
*H03F 1/02*    (2006.01)
(52) U.S. Cl. ........................... 330/9; 330/51
(58) Field of Classification Search ............. 330/9, 330/51, 253, 257
See application file for complete search history.

(56) References Cited

U.S. PATENT DOCUMENTS

| 5,311,145 | A  |   | 5/1994  | Huijsing |         |
|-----------|----|---|---------|----------|---------|
| 6,586,990 | B2 | * | 7/2003  | Udo et al. | 330/9 |
| 7,081,792 | B2 | * | 7/2006  | Kasai et al. | 330/9 |
| 7,116,161 | B2 | * | 10/2006 | Nakahira | 330/9 |

FOREIGN PATENT DOCUMENTS

| JP | 3520106    | 11/1994 |
|----|------------|---------|
| JP | 11-249623  | 9/1999  |

* cited by examiner

*Primary Examiner*—Henry K Choe
(74) *Attorney, Agent, or Firm*—McGinn IP Law Group, PLLC

(57) ABSTRACT

An operational amplifier includes a differential pair section; a load section configured to function as active load of the differential pair section; and a switch section configured to switch supply of a differential input signal to the differential pair section and to switch connection of outputs of the differential pair section to the load section. The switch section is operated to cancel an offset voltage of the operation amplifier.

20 Claims, 6 Drawing Sheets

OPERATIONAL AMPLIFIER WITH LESS OFFSET VOLTAGE

BACKGROUND OF THE INVENTION

1. Field of the Invention

The present invention relates to an operational amplifier, and more particularly relates to an operational amplifier that is not much influenced by an offset voltage.

2. Description of the Related Art

Conventionally, an operational amplifier was typically configured of bipolar transistors. However, recently, the operational amplifier has been also configured of MOS transistors in many cases due to the necessity of integration with a MOS (petal Oxide Semiconductor) circuit and the request of a low power. In order to form the operational amplifier by using the MOS transistors, the circuit configuration different from the operational amplifier configured of the bipolar transistors is adopted because of the analog characteristics peculiar to the MOS transistor. As one of application fields of the operational amplifier configured of the MOS transistors, there is a TFT_LCD (Thin Film Transistor Liquid Crystal Display) driver LSI (Large Scale Integrated Circuit). This LCD driver LSI contains therein a plurality of operational amplifiers of a voltage follower configuration for a γ compensation gradation voltage generating circuit. In particular, the device in which an offset voltage between the plurality of operational amplifiers is small is required. This is because even the voltage difference of 10 mV can be recognized as a different gradation by a human's eye from the characteristic of TFT_LCD. Thus, this field requires the MOS operational amplifier of a very small offset voltage.

FIGS. 1A and 1B are circuit diagrams showing a configuration example of an operational amplifier applied to a drive a conventional image display. This conventional operational amplifier is disclosed in Japanese Laid Open Patent Application (JP-A-Heisei 11-249623). This conventional operational amplifier includes two P-channel MOS transistors MP11 and MP12 of a differential pair, a constant current source I11, N-channel MOS transistors MN11 and MN12 of a current mirror circuit, an N-channel MOS transistor MN13, a constant current source I12, a phase compensation capacitor C11, break type switches S11, S14, S16 and S18, and make type switches S12, S13, S15 and S17.

A drain of one P-channel MOS transistor MP11 of the differential pair is connected to a drain of the N-channel MOS transistor MN11. Also, a drain of the other P-channel MOS transistor MP12 forming the differential pair is connected to a drain of the N-channel MOS transistor MN12. The constant current source I11 is inserted between a positive power source VDD and a source commonly connected to the P-channel MOS transistors MP11 and MP12 and biases this differential pair. The N-channel MOS transistors MN11 and MN12 of a current mirror structure function as an active load of the differential pair, and converts an input differential signal into a single end signal. The N-channel MOS transistor MN13 forms an amplifying circuit at a second stage. The constant current source I12 is inserted between the positive power source VDD and a drain of the N-channel MOS transistor MN13 and acts as an active load of this N-channel MOS transistor MN13. The phase compensation capacitor C11 is connected between a gate and drain of the N-channel MOS transistor MN13.

The break type switch S11 is connected between a gate and drain of the N-channel MOS transistor MN11. The make type switch S12 is connected between a gate and drain of the N-channel MOS transistor MN12. The make type switch S13 is connected between the drain of the N-channel MOS transistor MN11 and the gate of the N-channel MOS transistor MN13. The break type switch S14 is connected between the drain of the N-channel MOS transistor MN12 and the gate of the N-channel MOS transistor MN13. The make type switch S15 is connected between an output terminal Vout and the gate of the P-channel MOS transistor MP12. The break type switch S16 is connected between the output terminal Vout and the gate of the P-channel MOS transistor MP11. The make type switch S17 is connected between an input terminal Vin and the gate of the P-channel MOS transistor MP11. The break type switch S18 is connected between the input terminal Vin and the gate of the P-channel MOS transistor MP2.

Those switches S11 to S18 are all linked and controlled, and switched for every frame. FIG. 1A shows a state in case of the odd-numbered frame, and FIG. 1B shows a state in case of the even-numbered frame. In the operational amplifier shown in FIGS. 1A and 1B, when the switch S11 is closed, the drain of the N-channel MOS transistor MN12 serves as its single end output, and when the switch S12 is closed, the drain of the N-channel MOS transistor MN11 serves as the single end output. In this way, since a node of the single end output is switched based on the states of the switches S11 and S12, the output node is selected through the switch S13 and the switch S14. The signal which is selected through the switch S13 and the switch S14 is supplied to the gate of the N-channel MOS transistor MN13 serving as the output transistor. At this time, the constant current source I12 acts as the active load of the N-channel MOS transistor MN13. The drain of the N-channel MOS transistor MN13 serves as the output terminal Vout. The phase compensation capacitor C11 functions for the phase compensation as a mirror capacitance.

Since this operational amplifier is used as a buffer amplifier, a so-called voltage follower connection is established in which an inversion input terminal and an output terminal are commonly connected. When the switches S11 to S14 are switched, the inversion input terminal may become the gate of the P-channel MOS transistor MP11 or the gate of the P-channel MOS transistor MP12. This is switched through the switches S15; and S16. In response to the switching, a non-inversion input terminal is switched. Thus, this is switched through the switches S17 and S18. That is, when the switch S11 and the switch S14 are closed, the inversion input terminal serves as the gate of the P-channel MOS transistor MP11. Thus, at this time, the switch S16 is closed, and the gate of the P-channel MOS transistor MP11 serving as the inversion input terminal and the output terminal Vout are commonly connected, which serve as the voltage follower connection. Since the non-inversion input terminal serves as the gate of the P-channel MOS transistor MP12, the switch S18 is closed. Then, it is connected to the input terminal Vin. Inversely, when the switch S12 and the switch S13 are closed, the inversion input terminal serves as the gate of the P-channel MOS transistor MP12. Thus, at this time, the switch S15 is closed, and the gate of the P-channel MOS transistor MP12 serving as the inversion input terminal and the output terminal Vout are commonly connected, which serve as the voltage follower connection. Since the non-inversion input terminal serves as the gate of the P-channel MOS transistor MP11, the switch S17 is closed. Then, it is connected to the input terminal Vin.

In this way, in accordance with the switching of the switches S11 to S18, there are the two states. The two states are switched for every frame (or in one horizontal period). Actually, a polarity inversion signal that is switched for each horizontal period is used to switch the switches S11 to S18 in many cases. In the states of the switches shown in FIG. 1A, it is supposed that an offset voltage (+Vos) is tentatively generated. When the switches S11 to S18 are switched which leads to the states of the switches shown in FIG. 1B, the offset voltage becomes −Vos. Thus, when those switches S11 to S18 are switched for every frame (or in one horizontal period), the offset is spatially dispersed. Then, the offset voltages are averaged to zero. Therefore, the averaged voltage, namely, the offset voltage is recognized as zero by the human's eye. In other words, this is the method to deceive the human's eye.

FIG. 2 shows a circuit diagram of a typical amplifier disclosed in Japanese Laid Open Patent Application (JP-A-Heisei 6-326529). This amplifier is not of a type for switching the switches and canceling the offset, differently from the amplifier shown in FIG. 1. With reference to FIG. 2, the amplifier can be considered by dividing into an input stage 21, a middle stage 22 and a final stage 23. The input stage 21 includes P-channel MOS transistors MP20, MP21 and MP22 and N-channel MOS transistors MN20, MN21 and MN22. The middle stage 22 includes P-channel MOS transistors MP23, MP24, MP25, MP26, MP27 and MP28, and the N-channel MOS transistors MN23, MN24, MN25, MN26, MN27 and MN28. The final stage 23 includes a P-channel MOS transistor MP29 and an N-channel MOS transistor MN29. The amplifier further includes phase compensation capacitors C21, C22 between the middle stage 22 and the final stage 23.

In the P-channel MOS transistors MP21 and MP22, their sources are commonly connected, and a P-channel differential pair is generated. The P-channel MOS transistor MP20 is connected between this P-channel differential pair and a positive power source VDD2. In the P-channel MOS transistor MP20, its source is connected to the positive power source VDD2, its drain is connected to the commonly connected sources of the P-channel MOS transistors MP21 and MP22, and its gate is connected to a constant voltage source terminal BP21. The P-channel MOS transistor MP20 acts as a constant current source.

In the N-channel MOS transistors MN21 and MN22, their sources are commonly connected, and an N-channel differential pair is generated. The N-channel MOS transistor MN20 is connected between this N-channel differential pair and a negative power source VSS2. In the N-channel MOS transistor MN20, its source is connected to the negative power source VSS2, its drain is connected to the commonly connected sources of the N-channel MOS transistors MN21 and MN22, and its gate is connected to a constant voltage source terminal BN21. The N-channel MOS transistor MN20 acts as a constant current source. The gate of the P-channel MOS transistor MP21 and the gate of the N-channel MOS transistor MN21 are connected to an input terminal INN. The gate of the P-channel MOS transistor MP22 and the gate of the N-channel MOS transistor MN22 are connected to an input terminal INP. The drain of the P-channel MOS transistor MP21 is connected to a connection node C between the drain of the N-channel MOS transistor MN23 and the source of the N-channel MOS transistor MN25 in the middle stage 22. The drain of the P-channel MOS transistor MP22 is connected to a connection node D between the drain of the N-channel MOS transistor MN24 and the source of the N-channel MOS transistor MN26. The drain of the N-channel MOS transistor MN21 is connected to a connection node A between the drain of the P-channel MOS transistor MP23 and the source of the P-channel MOS transistor MP25. The drain of the N-channel MOS transistor MN22 is connected to a connection node B between the drain of the P-channel MOS transistor MP24 and the source of the P-channel MOS transistor MP26.

In the P-channel MOS transistors MP23 and MP24, their sources are connected to each other, and their gates are connected to each other. The commonly connected sources are connected to the positive power source VDD2. The drain of the P-channel MOS transistor MP23 is connected to the node A. The drain of the P-channel MOS transistor MP24 is connected to the node B. In the P-channel MOS transistor MP25, its source is connected to the node A, its drain is connected to the commonly connected gates of the P-channel MOS transistors MP23 and MP24, the source of the P-channel MOS transistor MP27 and the drain of the N-channel MOS transistor MN27. In the P-channel MOS transistor MP26, its source is connected to the node B, and its drain is connected to the source of the P-channel MOS transistor MP28, the drain of the N-channel MOS transistor MN28 and the gate of the P-channel MOS transistor MP29. The gates of the P-channel MOS transistors MP25 and MP26 are commonly connected and further connected to a constant voltage source terminal BP22. In the N-channel MOS transistors MN23 and MN24, their sources are connected to each other, and their gates are connected to each other. The commonly connected sources are connected to the negative power source VSS2. The drain of the N-channel MOS transistor MN23 is connected to the node C. The drain of the N-channel MOS transistor MN24 is connected to the node D. In the N-channel MOS transistor MN25, its source is connected to the node C, its drain is connected to the commonly connected gates of the N-channel MOS transistors MN23 and MN24, the source of the N-channel MOS transistor MN27 and the drain of the P-channel MOS transistor MP27. In the N-channel MOS transistor MN26, its source is connected to the node D, and its drain is connected to the source of the N-channel MOS transistor MN28, the drain of the P-channel MOS transistor MP28 and the gate of the N-channel MOS transistor MN29. The gates of the N-channel MOS transistors MN25 and MN26 are commonly connected and further connected to a constant voltage source terminal BN22.

In the P-channel MOS transistor MP27, its gate is connected to a constant voltage source terminal BP23, its source is connected to the drain of the P-channel MOS transistor MP25, and its drain is connected to the drain of the N-channel MOS transistor MN25. In the N-channel MOS transistor MN27, its gate is connected to a constant voltage source terminal BN23, its source is connected to the drain of the N-channel MOS transistor MN25, and its drain is connected to the drain of the P-channel MOS transistor MP25. The P-channel MOS transistor MP27 and the N-channel MOS transistor MN27 act as a floating constant current source. In the P-channel MOS transistor MP28, its gate is connected to a constant voltage source terminal BP24, its source is connected to the drain of the P-channel MOS transistor MP26, and its drain is connected to the drain of the N-channel MOS transistor MN26. In the N-channel MOS transistor MN28, its gate is connected to a constant voltage source terminal BN24, its source is connected to the drain of the N-channel MOS transistor MN26, and its drain is connected to the drain of the P-channel MOS transistor MP26. The P-channel MOS transistor MP28 and the N-channel MOS transistor MN28 act as the floating constant current source. The P-channel MOS transistor MP29 is the output transistor where its source is connected to the positive power source VDD2, its gate is connected to the source of the P-channel MOS transistor MP28, and its drain is connected to the output terminal OUT. The N-channel MOS transistor MN29 is the output transistor where its source is connected to the negative power source VSS2, its gate is connected to the source of the N-channel MOS transistor MN28, and its drain is connected to the output terminal OUT.

In the phase compensation capacitor C21, one end is connected to the node B, and the other end is connected to the output terminal OUT. In the phase compensation capacitor C22, one end is connected to the node D, and the other end is connected to the output terminal OUT.

A differential amplifier shown in FIG. 2 is a so-called Rail-to-Rail amplifier. The input stage 21 has the differential stage configuration in which the differential pair of the P-channel MOS transistors and the differential pair of the N-channel MOS transistors are combined, in order to attain the Rail-to-Rail. Thus, the output of the differential pair of the P-channel MOS transistors and the output of the differential pair of the N-channel MOS transistors are required to be added. For this reason, a differential stage output is connected to each of the node A, the node B, the node C and the node D in a so-called folded cascode connection. With such a connection, the outputs of the differential pair of the P-channel MOS transistors and the differential pair of the N-channel MOS transistors are current-added. With such a configuration, the differential pair of the N-channel MOS transistors is operated in the range of the input signal where the differential pair of the P-channel MOS transistors is not operated. On the contrary, the differential pair of the P-channel MOS transistors is operated in the range of the input signal where the differential pair of the N-channel MOS transistors is not operated. As a result, it is possible to obtain the input stage for the operation in the input ranges of all of the power source voltages.

As mentioned above, the P-channel differential amplifier for canceling the offset can be treated by the circuit shown in FIG. 1, and the design based thereon does not bring about any problem. Also, in case of the N-channel differential amplifier, this can be attained only by inverting the polarity of the transistor in FIG. 1. However, in the differential amplifier other than them, there is a case that the idea similar to FIG. 1 cannot be applied. For example, if the principle similar to FIG. 1 is applied to the differential amplifier shown in FIG. 2, the circuit becomes very complex. The desirable operation cannot be attained even if the transistors acting as the active loads are switched simply as indicated in FIG. 1. That is, the desirable operation cannot be attained even if the inputs and outputs of the current mirror circuit composed of the P-channel MOS transistors MP23 to MP26 and the N-channel MOS transistors MN23 to MN26 are switched to then change the connections to the gates of the output transistors MP29, MN29. It is necessary to switch all of the connections to the active loads and the transistors MP27 and MN27 for determining an idling current of the middle stage 22 and the connections between the output transistors MP29 and MN29 and the transistors MP28 and MN28 for determining an idling current of the final stage 23. Trying to attain them results in a problem that the number of the switches required to switch is enormous.

SUMMARY OF THE INVENTION

In an aspect of the present invention, an operational amplifier includes a differential pair section; a load section configured to function as active load of the differential pair section; and a switch section configured to switch supply of a differential input signal to the differential pair section and to switch connection of outputs of the differential pair section to the load section. The switch section is operated to cancel an offset voltage of the operation amplifier.

Here, the load section may be composed of a first pair of P-channel MOS transistors connected to a higher power supply voltage; a second pair of P-channel MOS transistors; a first load switch section configured to switch connections between the P-channel MOS transistors of the first pair and the P-channel MOS transistors of the second pair; a third pair of N-channel MOS transistors connected to a lower power supply voltage; a fourth pair of N-channel MOS transistors; a second load switch section configured to switch connections between the N-channel MOS transistors of the third pair and the N-channel MOS transistors of the fourth pair; a floating constant current source provided between one of the P-channel MOS transistors of the second pair and one of the N-channel MOS transistors of the fourth pair to supply a constant current; and an output buffer amplifier connected to provided between the other of the P-channel MOS transistors of the second pair and the other of the N-channel MOS transistors of the fourth pair.

Also, a drain of the one of the P-channel MOS transistors of the second pair may be connected in common to gates of the P-channel MOS transistors of the first pair to form a folded cascode connection, and gates of the P-channel MOS transistors of the second pair may be connected in common to a first constant voltage, and a drain of the one of the N-channel MOS transistors of the fourth pair may be connected in common to gates of the N-channel MOS transistors of the third pair to form a folded cascode connection, and gates of the P-channel MOS transistors of the fourth pair are connected in common to a second constant voltage.

Also, one of inputs of the differential pair section may be connected with a non-inversion signal of the differential signal and the other input of the differential pair may be connected to an output of the output buffer amplifier.

Also, the differential pair may include a fifth pair of N-channel MOS transistors, and each of drains of the N-channel MOS transistors of the fifth pair may be connected to one of sources of the P-channel MOS transistors of the second pair.

Also, the differential pair may include a sixth pair of P-channel MOS transistors, and each of drains of the P-channel MOS transistors of the sixth pair may be connected to one of sources of the N-channel MOS transistors of the fourth pair.

Also, the differential pair may include a fifth pair of N-channel MOS transistors; and a sixth pair of P-channel MOS transistors. Each of drains of the N-channel MOS transistors of the fifth pair may be connected to one of sources of the P-channel MOS transistors of the second pair, and each of drains of the P-channel MOS transistors of the sixth pair may be connected to one of sources of the N-channel MOS transistors of the fourth pair.

Also, the switch section may include a first switch configured to switch to connect the non-inversion signal of the differential input signal to one of gates of the N-channel MOS transistors of the fifth pair; a second switch configured to switch to connect the output of the operational amplifier to the other of the gates of the N-channel MOS transistors of the fifth pair; and a third switch configured to switch connections of the drains of the N-channel MOS transistors of the fifth pair to the sources of the P-channel MOS transistors of the second pair.

Also, the switch section may include a fourth switch configured to switch to connect the non-inversion signal of the differential input signal to one of gates of the P-channel MOS transistors of the sixth pair; a fifth switch configured to switch to connect the output of the operational amplifier to the other of the gates of the P-channel MOS transistors of the sixth pair; and a sixth switch configured to switch connections of the drains of the P-channel MOS transistors of the fifth pair to the sources of the N-channel MOS transistors of the fourth pair.

Also, the switch section may include a first switch configured to switch to connect the non-inversion signal of the differential input signal to one of gates of the N-channel MOS transistors of the fifth pair; a second switch configured to switch to connect the output of the operational amplifier to the other of the gates of the N-channel MOS transistors of the fifth pair; a third switch configured to switch connections of the drains of the N-channel MOS transistors of the fifth pair to the sources of the P-channel MOS transistors of the second pair; a fourth switch configured to switch to connect the non-inversion signal of the differential input signal to one of gates of the P-channel MOS transistors of the sixth pair; a fifth switch configured to switch to connect the output of the operational amplifier to the other of the gates of the P-channel MOS transistors of the sixth pair; and a sixth switch configured to switch connections of the drains of the P-channel MOS transistors of the fifth pair to the sources of the N-channel MOS transistors of the fourth pair.

Also, the first to third switches may be operated in connection to each other. In addition, the fourth to sixth switches may be operated in connection to each other.

Also, the load section may include a pair of load transistors configured to function as active load; a pair of bias transistors to whose gates a bias voltage is applied; and a load switch section configured to switch connection between the pair of load transistors and the pair of bias transistors. The load transistors and the bias transistors may form folded cascode connection.

Also, the switch section may be driven in response to a polarity inversion signal which is switched for every horizontal period of a display.

In another aspect of the present invention, an operational amplifier includes an N-channel differential pair transistors in which a differential input pair is connected to a non-inversion input terminal and an inversion input terminal connected to an output terminal; a P-channel differential transistor pair in which a differential input pair is connected to the non-inversion input terminal and the inversion input terminal; a first switch configured to switch a connection destination of each of drains of the N-channel differential pair transistors; a second switch configured to switch a connection destination of each of drains of the P-channel differential pair transistors; and a first group of P-channel MOS transistors whose sources are connected to a positive power supply in common, and whose gates are connected in common and to act as an active load of folded cascode connection. The operational amplifier further includes a first group of N-channel MOS transistors whose sources are connected in common to a negative power supply, and whose gates are connected in common to act as an active load of a folded cascode connection; a second group of P-channel MOS transistors whose gates are connected in common to each other; a second group of the N-channel MOS transistors whose gates are connected in common to each other; a third switch connected between drains of the first group of P-channel MOS transistors and sources of the second group of P-channel MOS transistors, and configured to switch connection between drains of the first group of P-channel MOS transistors and sources of the second group of P-channel MOS transistors; a fourth switch connected between drains of the first group of N-channel MOS transistors and sources of the second group of N-channel MOS transistors, and configured to switch connection between drains of the first group of N-channel MOS transistors and sources of the second group of N-channel MOS transistor; a fifth switch having a common terminal connected to an input terminal and make and break terminals connected to gates of the N-channel differential pair transistors; a sixth switch having a common terminal connected to the output terminal and make and break terminals connected to gates of the N-channel differential pair transistors; a seventh switch having a common terminal connected to the input terminal and make and break terminals connected to gates of the P-channel differential pair transistors; and a eighth switch having a common terminal connected to the output terminal and make and break terminals connected to gates of the P-channel differential pair transistors. The operation amplifier further includes a first constant current source connected between a negative power supply and sources connected in common of the N-channel differential pair transistors; a second constant current source connected between a positive power supply with sources connected in common of the P-channel differential pair transistors; a third constant current source as a floating current source having one end connected with a drain of one of the P-channel MOS transistors of the second group and gates of the P-channel MOS transistors of the first group in common, and the other end connected with a drain of one of the N-channel MOS transistors of the second group and gates of the N-channel MOS transistors of the first group in common; a first constant voltage source connected between the positive power supply and gates of the P-channel MOS transistors of the second group; a second constant voltage source connected between the negative power supply and gates of the N-channel MOS transistor of the second group; and an output buffer amplifier having input terminals connected to a drain of the other of the P-channel MOS transistors of the second group and a drain of the other of the N-channel MOS transistors of the second group.

Here, the first switch, the fifth switch and the sixth switch may constitute a first switch group and operate in connection with each other.

Also, the second switch, the seventh switch and the eighth switch may constitute a second switch group and operate in connection with each other.

DESCRIPTION OF THE PREFERRED EMBODIMENTS

Hereinafter, an operational amplifier of the present invention will be described in detail with reference to the attached drawings.

First Embodiment

Figure 1A:
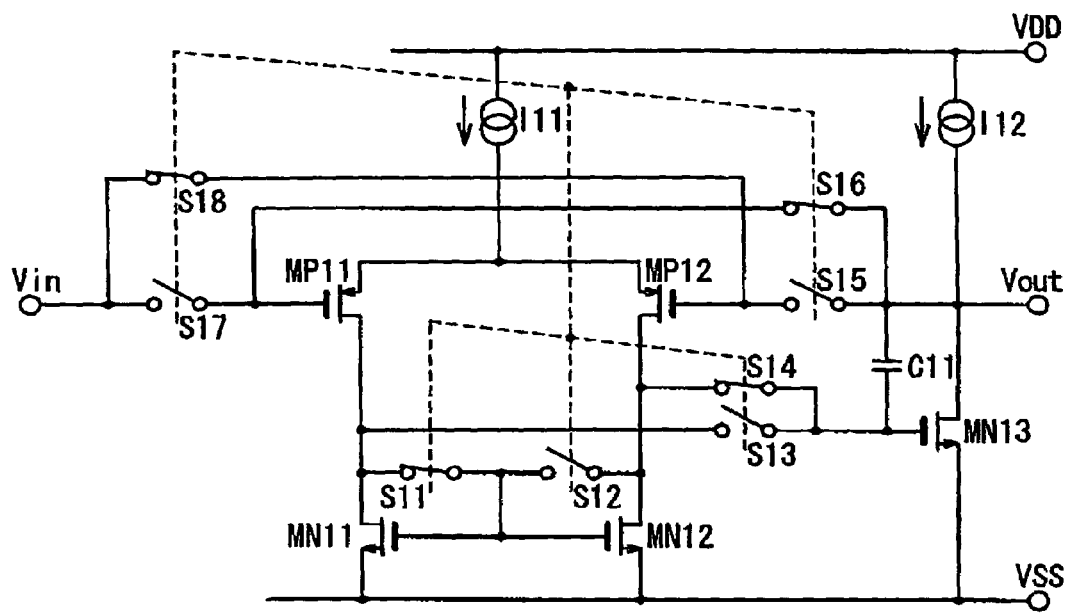
FIGS. 1A and 1B are circuit diagrams showing a configuration example of an operational amplifier applied to a drive a conventional image display.
Figure 1B:
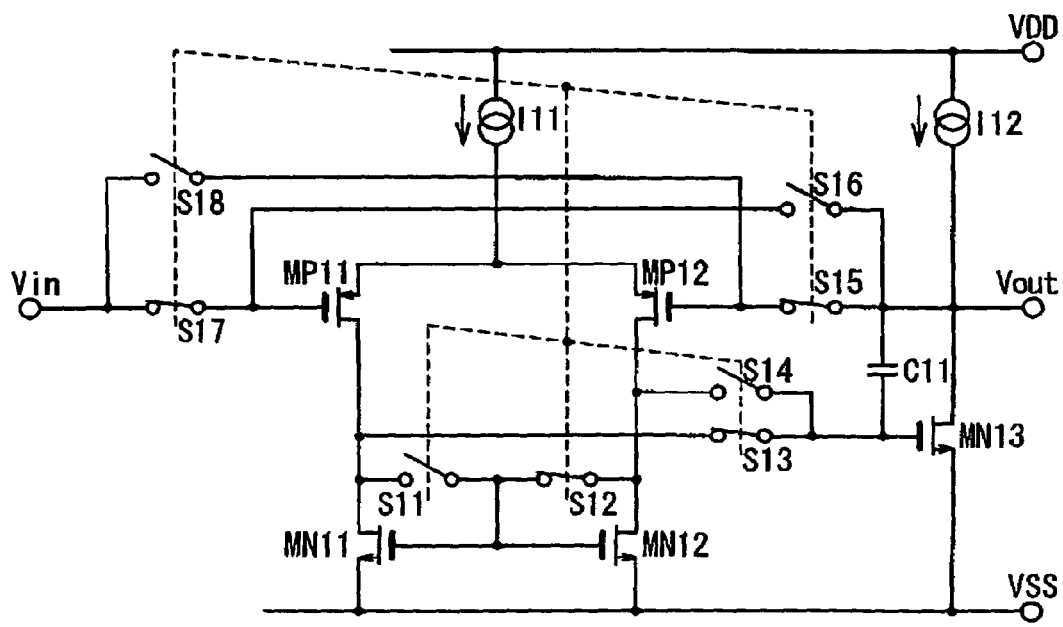
Figure 2:
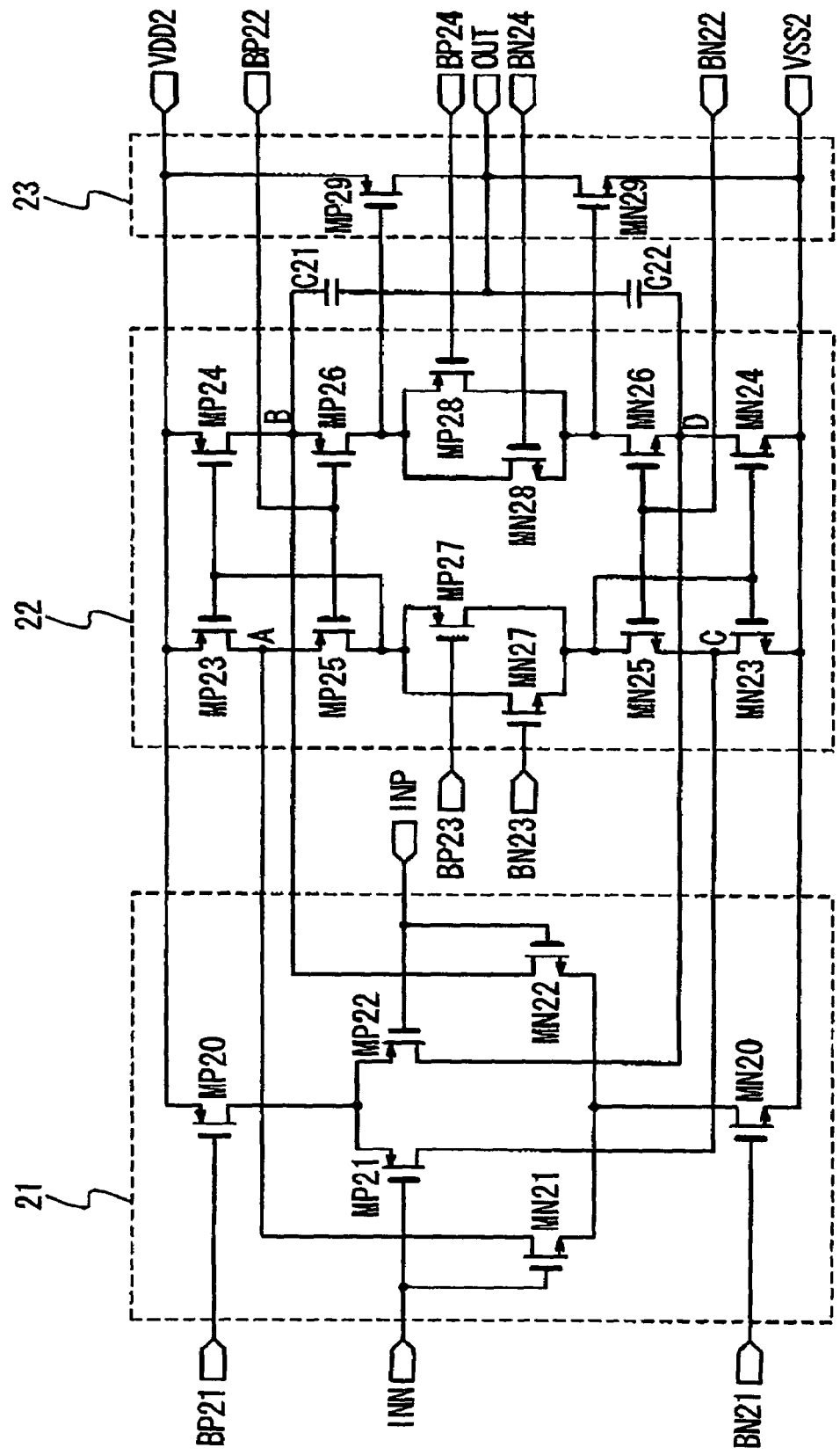
FIG. 2 is a circuit diagram showing a configuration example of another conventional operational amplifier.
Figure 3:
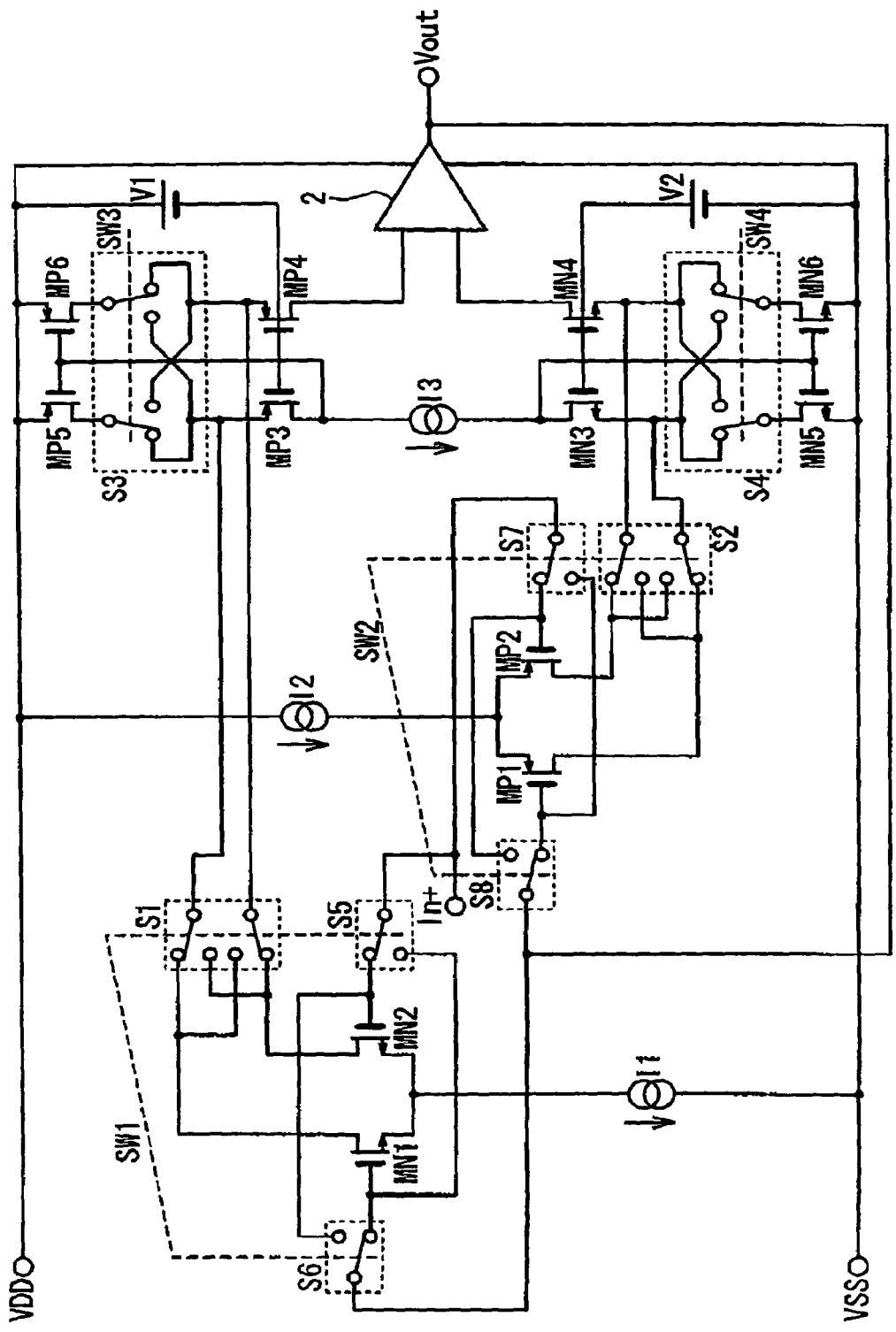
FIG. 3 is a circuit diagram showing a configuration of an equivalent circuit of a differential amplifier according to the first embodiment of the present invention.

FIG. 3 is an equivalent circuit of an operational amplifier circuit according to the first embodiment of the present invention. Referring to FIG. 3, the operational amplifier circuit in the first embodiment includes N-channel MOS transistors MN1 and MN2 as an N-channel differential pair; P-channel MOS transistors MP1 and MP2 as a P-channel differential pair; switches S1 to S8; P-channel MOS transistors MP3 to MP6; N-channel MOS transistors MN3 to MN6; constant current sources I1 to I3; constant voltage sources VI and V2; and an output buffer amplifier 2.

In the N-channel MOS transistors MN1 and MN2 as the N-channel differential pair, input terminals of the differential pair are connected to a non-inversion input terminal In⁺ and an inversion input terminal of the operation amplifier, and the inversion input terminal is connected to an output terminal Vout of the operation amplifier. The constant current source I1 is connected between the negative power source VSS and commonly connected sources of the N-channel MOS transistors MN1 and MN2. A switch group SW1 includes switches S1, S5 and S6, and is controlled in response to a switch control signal. That is, the switches S1, S5 and S6 operate in connection to each other. The switch SI switches the connections of the respective drains of the N-channel MOS transistors MN1 and MN2. In the switch S5, its common terminal is connected to the non-inversion input terminal In+. A make terminal of the switch S5 is connected to the gate of the N-channel MOS transistor MN2, and a break terminal is connected to the gate of the N-channel MOS transistor MN1. In the switch S6, its common terminal is connected to the output terminal Vout. A break terminal of the switch S6 is connected to the gate of the N-channel MOS transistor MN2, and a make terminal is connected to the gate of the N-channel MOS transistor MN1. That is, the switch S5 switches a non-inversion input signal of an N-channel differential pair, and the switch S6 switches an inversion input signal of the N-channel differential pair.

In the P-channel MOS transistors MP1 and MP2 as the P-channel differential pair, input terminals of the differential pair are connected to the non-inversion input terminal In⁺ and the inversion input terminal of the operation amplifier that is connected to the output terminal Vout. The constant current source 12 is connected between a positive power source VDD and commonly connected sources of the P-channel MOS transistors MP1 and MP2. A switch group SW2 includes switches S2, S7 and S8, and is controlled in response to a switch control signal. That is, the switches S2, S7 and S8 operate in connection to each other. The switch S2 switches the connections of the respective drains of the P-channel MOS transistors MP1 and MP2. In the switch S7, its common terminal is connected to the non-inversion input terminal In+. A make terminal of the switch S7 is connected to the gate of the P-channel MOS transistor MP2, and a break terminal is connected to the gate of the P-channel MOS transistor MP1. In the switch S8, its common terminal is connected to the output terminal Vout. A break terminal of the switch S8 is connected to the gate of the P-channel MOS transistor MP2, and a make terminal is connected to the gate of the P-channel MOS transistor MP1. That is, the switch S7 switches the non-inversion input signal of the P-channel differential pair, and the switch S8 switches the inversion input signal of the P-channel differential pair.

In the P-channel MOS transistors MP5 and MP6, their sources are commonly connected to the positive power source VDD, and their gates are commonly connected to each other. The P-channel MOS transistors MP5 and MP6 function as an active load of folded cascode connections. In the P-channel MOS transistors MP3 and MP4, their gates are commonly connected to each other, and a constant voltage source V1 is connected thereto. That is, the constant voltage source V1 is connected between the positive power source VDD and the commonly connected gates of the P-channel MOS transistors MP3 and MP4. The sources of the P-channel MOS transistors MP3 and MP4 are connected through a switch S3 to the drains of the P-channel MOS transistors MP5 and MP6. That is, the switch S3 switches the connection of the drain of the P-channel MOS transistor MP5 between the respective sources of the P-channel MOS transistors MP3 and MP4. Also, the switch S3 switches the connection of the drain of the P-channel MOS transistor MP6 between the respective sources of the P-channel MOS transistors MP3 and MP4. A switch group SW3 includes the switch S3, which operates in response to a switch control signal. The drain of the P-channel MOS transistor MP3 is connected to the commonly connected gates of the P-channel MOS transistors MP5 and MP6. Nodes between the switch S3 and the transistors MP3 and MP4 are connected to the drains of the N-channel MOS transistors MN1 and MN2 through the switch S1.

Similarly, in the N-channel MOS transistors MN5 and MN6, their sources are commonly connected to the negative power source VSS, and their gates are commonly connected to each other. The N-channel MOS transistors MN5 and MN6 act as an active load of folded cascode connections. In the N-channel MOS transistors MN3 and MN4, their gates are commonly connected to each other, and a constant voltage source V2 is connected thereto. That is, the constant voltage source V2 is connected between the negative power source VSS and the commonly connected gates of the N-channel MOS transistors MN3 and MN4. The sources of the N-channel MOS transistors MN3 and MN4 are connected through a switch S4 to the drains of the N-channel MOS transistors MN5 and MN6. The switch S4 is connected between the respective drains of the N-channel MOS transistors MN5 and MN6 and the respective sources of the N-channel MOS transistors MN3 and MN4. That is, the switch S4 switches the connection of the drain of the N-channel MOS transistor MN5 between the respective sources of the N-channel MOS transistors MN3 and MN4. Also, the switch S4 switches the connection of the drain of the N-channel MOS transistor MN6 between the respective sources of the N-channel MOS transistors MN3 and MN4. A switch group SW4 includes the switch S4, which operates in response to a switch control signal. The drain of the N-channel MOS transistor MN3 is connected to the commonly connected gates of the N-channel MOS transistors MN5 and MN6. Nodes between the switch S4 and the transistors MN3 and MN4 are connected to the drains of the P-channel MOS transistors MP1 and MP2 through the switch S2.

The constant current source I3 is a floating current source. One end of the constant current source I3 is to a node to which the drain of the P-channel MOS transistor MP3 and the gates of the P-channel MOS transistors MP5 and MP6 are connected. The other end is connected to a node to which the drain of the N-channel MOS transistor MN3 and the gates of the N-channel MOS transistors MN5 and MN6 are connected.

In the output buffer amplifier 2 functioning as an output buffer, two inputs are connected to the drain of the P-channel MOS transistor MP4 and the drain of the N-channel MOS transistor MN4. The output of the output buffer amplifier 2 is connected to the output terminal Vout and fed back to the inversion input terminal.

The P-channel MOS transistors MP3 to MP6, the switch 33 constitute a current mirror circuit section, the N-channel MOS transistors MN3 to MN6, the switch S4, the constant current source I3 and the output buffer amplifier 2 constitute a current mirror circuit section. The P-channel MOS transistors MP5 and MP6 and the N-channel MOS transistors MN5 and MN6 functions as loads of the N-channel differential pair and the P-channel differential pair, respectively. Also, the P-channel MOS transistors MP3 and MP4, the N-channel MOS transistors MN3 and MN4, the floating constant current source I3 and the output buffer amplifier 2 function as an output section.

The operation of this operational amplifier will be described below with reference to FIG. 3. The switches S1, S5 and S6 are operated together as a switch group SW1 and driven at the same time. Also, the switches S2, S7 and S8 are operated together as a switch group SW2 and driven at the same time. The switch S3 and the switch S4 are respectively independently driven. That is, the operation pattern is divided into the four switch groups.

(1) Switch Group SW1 (S1, S5, S6)
(2) Switch Group SW2 (S2, S7, S8)
(3) Switch Group SW3 (S3)
(4) Switch Group SW4 (S4)

Those switch groups SW1 to SW4 can be driven independently of each other. For example, a case of switching the switch group SW1 will be described. Here, an offset voltage generated due to a mismatched factor between the N-channel MOS transistors MN1 and MN2 of the differential pair is assumed to be Vos (N-differential), and a total of offset voltage due to other factors is assumed to be VOS (except the N-differential). When an input voltage is assumed to be VIN, an output voltage Vo is represented by the following equation.

$$Vo = VIN + VOS \text{ (except the } N\text{-differential)} \pm Vos \text{ (} N \text{ differential)}$$

Here, "±" is the result of the output after the polarity is switched by switching the switch group SW1. Thus, when the switch group SW1 is switched to calculate a time average, the item of ±Vos (N-differential) becomes 0. That is, through switching of the switch group SW1, the influence of the offset voltage generated due to the mismatched factor between the N-channel MOS transistors MN1 and MN2 can be eliminated.

Similarly, when the switch group SW2 is switched, an offset voltage generated due to a mismatched factor between the P-channel MOS transistors MP1 and MP2 of the differential pair is assumed to be Vos (P-difference), and a total of offset voltage generated due to other factors is assumed to be VOS (except the P-differential). When an input voltage is assumed to be VIN, an output voltage Vo is represented by the following equation.

$$Vo = VIN + VOS \text{ (except the } P\text{-differential)} \pm Vos \text{ (} P \text{ differential)}$$

With regard to the switching of the switch group SW3 and the switch group SW4, in accordance with the similar principle, the offset voltage is outputted after the polarity is switched on the basis of the state of the switch. The offset voltages become zero by turning ON/OFF (switching) the switch groups SW1 to SW4. Consequently, the offset voltages generated due to the respective element groups become zero. Thus, since all of the switches are entirely turned ON/OFF, all of the offset voltages are averaged to zero. Therefore, the influence of the offset voltage is reduced.

With regard to these four switch groups, there are the two states of ON/OFF, respectively. Thus, there are the 16 possible states based on $2^4$. However, it is not necessary to generate all of those states. For example, by operating the switch group SW1 and the switch group SW2 together and assuming the three switch groups of (SW1+SW2), SW3 and SW4, a total of 8 states are considered. Moreover, by operating all of the switch groups, it is allowable to switch under the two states of ON/OFF. In this way, the respective switch groups may be operated together under any combination.

Figure 4:
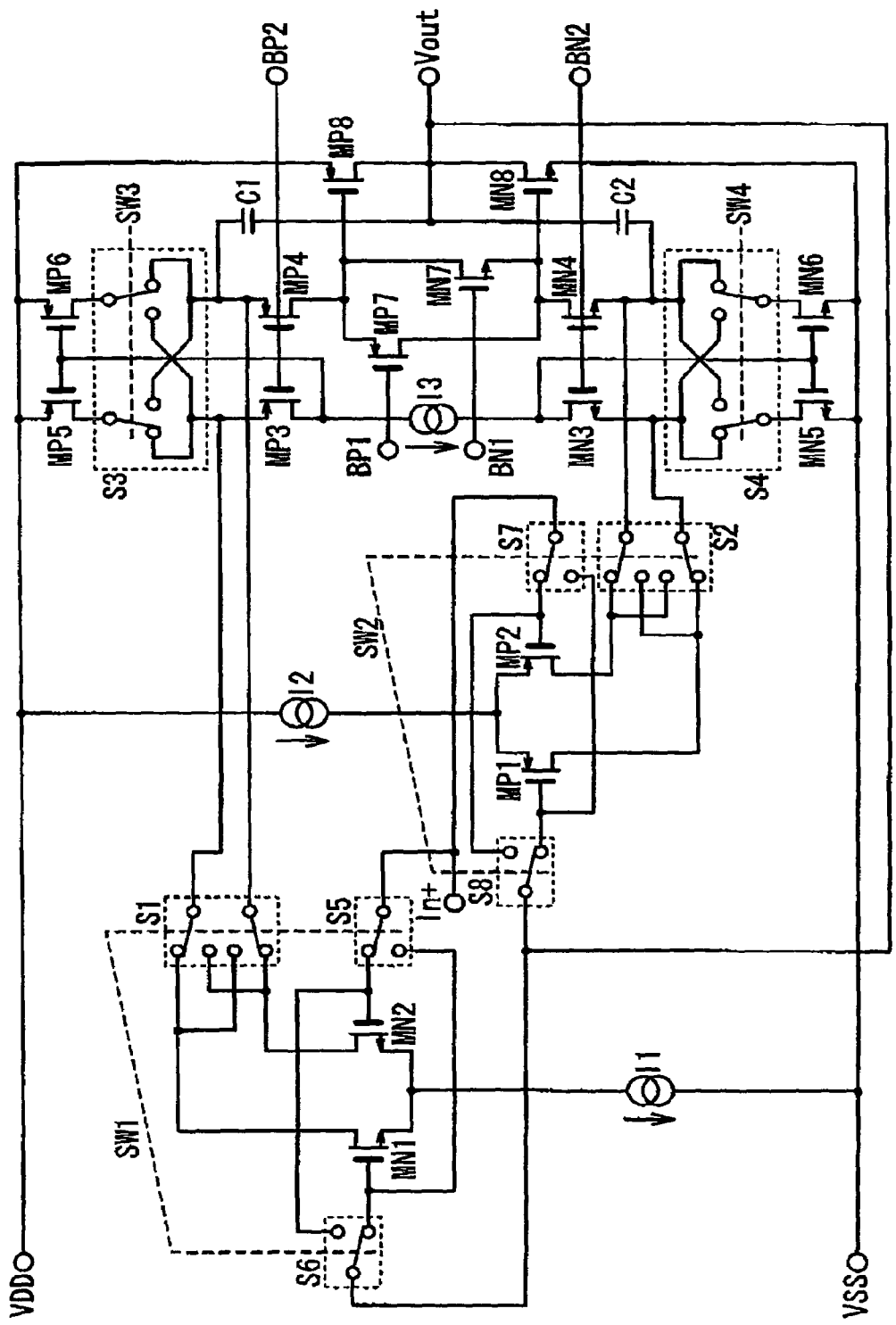
FIG. 4 is a circuit diagram showing the configuration of a specific example the differential amplifier according to the first embodiment of the present invention.

FIG. 4 shows the configuration of a specific example of the operational amplifier according to the first embodiment of the present invention, in which the output buffer amplifier 2 in FIG. 3 has a specific configuration. It should be noted that the description of the same components as those in FIG. 3 is omitted. Referring to FIG. 4, the output buffer amplifier 2 includes a P-channel MOS transistor MP8, an N-channel MOS transistor MN8, a P-channel MOS transistor MP7, a N-channel MOS transistor MN7, a capacitor C1 and a capacitor C2. It should be noted that it is assumed that the constant voltage sources V1 and V2 are connected to the constant voltage source terminals BP2 and BN2, respectively, and they are omitted.

In the P-channel MOS transistor MP8, its gate is connected to the drain of the P-channel MOS transistor MP4, its source is connected to the positive power source VDD, and its drain is connected to the output terminal Vout of the output buffer amplifier 2. In the N-channel MOS transistor MN8, its gate is connected to the drain of the N-channel MOS transistor MN4, its source is connected to the negative power source VSS, and its drain is connected to the output Vout of the output buffer amplifier 2. In the P-channel MOS transistor MP7, its source is connected to the gate of the P-channel MOS transistor MP8, its gate is connected to the constant voltage source terminal BP1, and its drain is connected to the gate of the N-channel MOS transistor MN8. The P-channel MOS transistor MP7 determines the idling current of the P-channel MOS transistor MP8. Also, in the N-channel MOS transistor MN7, its source is connected to the gate of the N-channel MOS transistor MN8, its gate is connected to the constant voltage source terminal BN1, and its drain is connected to the gate of the P-channel MOS transistor MP8. The N-channel MOS transistor MN7 determines the idling current of the N-channel MOS transistor MN8. The capacitor C1 functions as a phase compensation capacitor. One end is connected to the source of the P-channel MOS transistor MP4, and the other end is connected to the output terminal Vout. The capacitor C2 functions as a phase compensation capacitor. One end is connected to the source of the N-channel MOS transistor MN4, and the other end is connected to the output terminal Vout.

The N-channel MOS transistor MN8 and the P-channel MOS transistor MP8 function as the so-called floating constant current source. A method of setting this floating constant current source will be described below. At first, a voltage $V_{(BP1)}$ of the constant voltage source connected to the terminal BP1 is equal to a sum of a voltage $V_{GS\,(MP7)}$ between the gate and source of the P-channel MOS transistor MP7 and a voltage $V_{GS\,(MP8)}$ between the gate and source of the P-channel MOS transistor MP8. Thus, the following equation (1) is met.

$$V_{(BP1)} = V_{GS\,(MP7)} + V_{GS\,(MP8)} \qquad (1)$$

Here, supposing that W is a gate width, L is a gate length, μ is a mobility, $C_O$ is a gate oxide film capacitance per unit area, $V_T$ is a threshold voltage, and $I_D$ is a drain current, the voltage $V_{GS}$ between the gate and source is represented by the following equation:

$$V_{GS} = \sqrt{\frac{2I_D}{\beta}} + V_T \quad (2)$$

Here, $$\beta = \frac{W}{L}\mu C_o$$

When the N-channel MOS transistors MN1 and MN2 of the differential pair operate as an amplifier, the drain currents of both transistors are equal. Thus, when the current of the current source I3 is assumed to be $I_3$, each drain current becomes I3/2. Typically, the bias voltages of the terminals BP1 and BN1 are determined such that the drain currents of the P-channel MOS transistor MP7 and the N-channel MOS transistor MN7 in the floating current source become equal. At this time, the relation between the bias voltage of the terminal BP1 and an idling current $I_{idle\,(MP8)}$ of the P-channel MOS transistor MP8 at the output stage is represented by the following equation. Here, $\beta_{(MP7)}$ indicates β of the P-channel MOS transistor MP7, and $\beta_{(MP8)}$ indicates β of the N-channel MOS transistor MP8.

$$V_{(BP1)} = \sqrt{\frac{I_3}{\beta_{(MP7)}}} + \sqrt{\frac{2I_{idle(MP8)}}{\beta_{(MP8)}}} + 2V_T \quad (3)$$

Here, although a specific circuit of the constant voltage source for generating the bias voltage $V_{(BP1)}$ is not indicated, this equation (3) can be solved for the $I_{idle(MP8)}$. Since the actual equation is a very complex equation, this equation is omitted here. Similarly, the voltage $V_{(BN1)}$ of the constant voltage source connected to the terminal BN1 is set such that the drain current of the N-channel MOS transistor MN7 and the drain current of the P-channel MOS transistor MP7 become equal.

In the above described way, the floating constant current source is set. Here, the constant voltage source (the voltage $V_{(BN1)}$ connected to the terminal BN1 and the constant voltage source (the voltage $V_{(BP1)}$) connected to the terminal BP1 are strong against variation caused due to the element deviation because they are constituted by using the two MOS transistors and constant current sources. According to the configuration, the item of "$2V_T$" appears in the equation in which $V_{(BP1)}$ is expanded along the circuit. Thus, the left side ($V_{(BP1)}$) of the equation (3) includes the item of "$2V_T$" equal to that of the right side, and this item is canceled between the left side and the right side. Thus, the specific circuit example of the constant voltage source is not illustrated.

Second Embodiment

Figure 5:
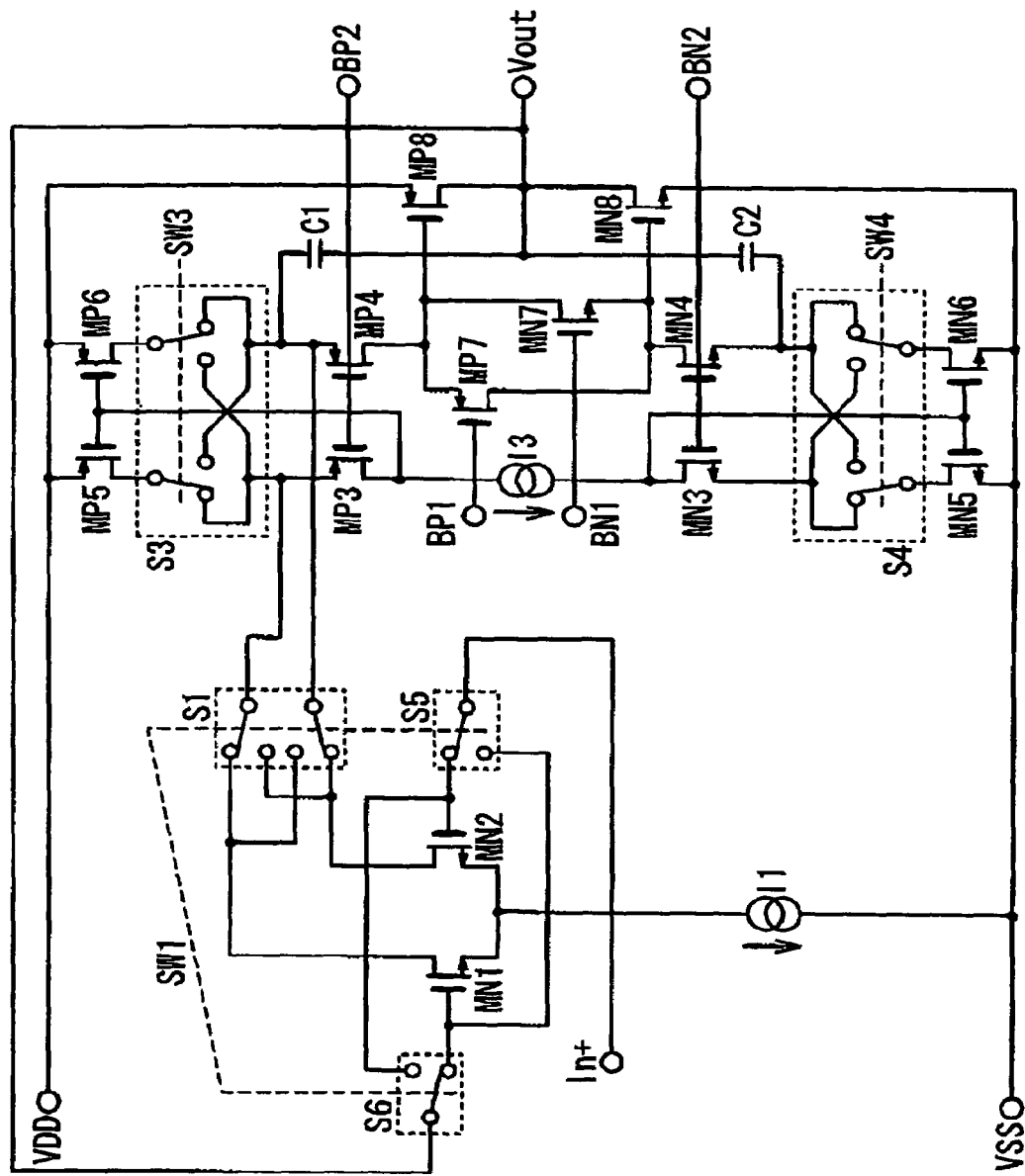
FIG. 5 is a circuit diagram showing the configuration of the operational amplifier according to a second embodiment of the present invention.

FIG. 5 is a circuit diagram in which the P-channel differential pair in FIG. 4 is omitted. When the Rail-to-Rail characteristic is not required and the input voltage is in a range between (Vss+about 1 volt) and (VDD), the P-channel differential pair in FIG. 4 is not required. Thus, in this case, it is possible to omit the P-channel MOS transistors MP1 and MP2 of the P-channel differential pair, and the constant current source I2. Even if those elements are omitted, the normal amplifying operation is possible. The circuit operation is basically same as that of the circuit in FIGS. 3 and 4 as mentioned above. Thus, the description of its operation is omitted.

Third Embodiment

Figure 6:
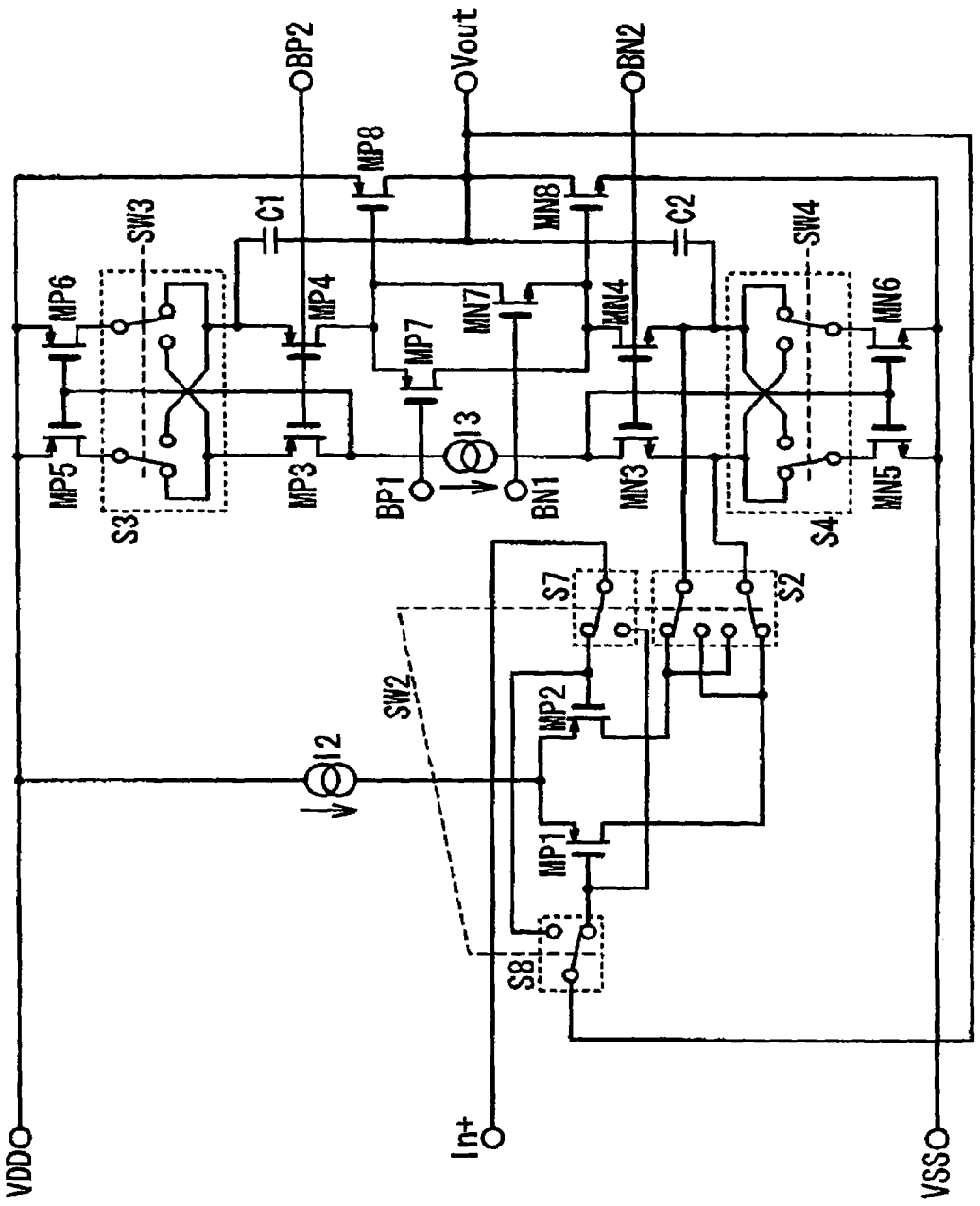
FIG. 6 is a circuit diagram showing the configuration of the operational amplifier according to a third embodiment of the present invention.

FIG. 6 is a circuit diagram in which the N-channel differential pair in FIG. 4 is omitted. When the Rail-to-Rail characteristic is not required and the input voltage is in a range between (Vss) and (VDD−about 1 volt), the N-channel differential pair in FIG. 4 is not required. Thus, in this case, it is possible to omit the N-channel MOS transistors MN1 and MN2 of the N-channel differential pair, and the constant current source I2. Even if those elements are omitted, the normal amplifying operation is possible. The circuit operation is basically same as that of the circuit in FIGS. 3 and 4 as mentioned above. Thus, its operation explanation is omitted.

As the operational amplifier, which is used for the output amplifier of the LCD source driver or for the gradation voltage generating circuit for determining the γ correction, the circuit whose offset voltage is as small as possible is required. Thus, any means is required to cancel the offset. The present invention attains a spatial offset canceling circuit with a simple circuit configuration, as mentioned above. Thus, according to the present invention, in the operational amplifier, it is possible to spatially distribute the offset voltage and consequently suppress the influence caused due to the apparent offset voltage. For example, this is suitable for the amplifying circuit for the LCD driver and the gradation power source circuit for determining the γ compensation, which are used to drive the capacitive load such as a liquid crystal panel.

According to the present invention, it is possible to provide the operational amplifier, which is not much influenced due to the offset voltage, under the simple circuit configuration. In particular, this operational amplifier is suitable for the LCD driver that is the typical circuit in the image field.

What is claimed is:

1. An operational amplifier, comprising:
   a differential pair section;
   a load section configured to function as active load of said differential pair section, said load section comprises:
   a first pair of P-channel MOS transistors connected to a higher power supply voltage;
   a second pair of P-channel MOS transistors;
   a first load switch section configured to switch connections between said P-channel MOS transistors of said first pair and said P-channel MOS transistors of said second pair;
   a third pair of N-channel MOS transistors connected to a lower power supply voltage;
   a fourth pair of N-channel MOS transistors;
   a second load switch section configured to switch connections between said N-channel MOS transistors of said third pair and said N-channel MOS transistors of said fourth pair;
   a floating constant current source provided between one of said P-channel MOS transistors of said second pair and one of said N-channel MOS transistors of said fourth pair to supply a constant current; and
   an output buffer amplifier connected to provided between the other of said P-channel MOS transistors of said second pair and the other of said N-channel MOS transistors of said fourth pair; and a switch section configured to switch supply of a differential input signal to said differential pair section and to switch connection of outputs of said differential pair section to said load section,
wherein said switch section is operated to cancel an offset voltage of said operational amplifier.

2. The operational amplifier according to claim 1, wherein a drain of the one of said P-channel MOS transistors of said second pair is connected in common to gates of said P-channel MOS transistors of said first pair to form a folded cascode connection, and gates of said P-channel MOS transistors of said second pair are connected in common to a first constant voltage, and
 a drain of the one of said N-channel MOS transistors of said fourth pair is connected in common to gates of said N-channel MOS transistors of said third pair to form a folded cascode connection, and gates of said P-channel MOS transistors of said fourth pair are connected in common to a second constant voltage.

3. The operational amplifier according to claim 2, wherein one of inputs of said differential pair section is connected with a non-inversion signal of the differential signal and the other input of said differential pair is connected to an output of said output buffer amplifier.

4. The operational amplifier according to claim 3, wherein said differential pair comprises:
 a fifth pair of N-channel MOS transistors, and
 each of drains of said N-channel MOS transistors of said fifth pair are connected to one of sources of said P-channel MOS transistors of said second pair.

5. The operational amplifier according to claim 3, wherein said differential pair comprises:
 a sixth pair of P-channel MOS transistors, and
 each of drains of said P-channel MOS transistors of said sixth pair are connected to one of sources of said N-channel MOS transistors of said fourth pair.

6. The operational amplifier according to claim 3, wherein said differential pair comprises:
 a fifth pair of N-channel MOS transistors; and
 a sixth pair of P-channel MOS transistors,
 each of drains of said N-channel MOS transistors of said fifth pair are connected to one of sources of said P-channel MOS transistors of said second pair, and
 each of drains of said P-channel MOS transistors of said sixth pair are connected to one of sources of said N-channel MOS transistors of said fourth pair.

7. The operational amplifier according to claim 4, wherein said switch section comprises:
 a first switch configured to switch to connect said non-inversion signal of said differential input signal to one of gates of said N-channel MOS transistors of said fifth pair;
 a second switch configured to switch to connect said output of said operational amplifier to the other of the gates of said N-channel MOS transistors of said fifth pair; and
 a third switch configured to switch connections of the drains of said N-channel MOS transistors of said fifth pair to the sources of said P-channel MOS transistors of said second pair.

8. The operational amplifier according to claim 5, wherein said switch section comprises:
 a fourth switch configured to switch to connect said non-inversion signal of said differential input signal to one of gates of said P-channel MOS transistors of said sixth pair;
 a fifth switch configured to switch to connect said output of said operational amplifier to the other of the gates of said P-channel MOS transistors of said sixth pair; and
 a sixth switch configured to switch connections of the drains of said P-channel MOS transistors of said fifth pair to the sources of said N-channel MOS transistors of said fourth pair.

9. The operational amplifier according to claim 6, wherein said switch section comprises:
 a first switch configured to switch to connect said non-inversion signal of said differential input signal to one of gates of said N-channel MOS transistors of said fifth pair;
 a second switch configured to switch to connect said output of said operational amplifier to the other of the gates of said N-channel MOS transistors of said fifth pair;
 a third switch configured to switch connections of the drains of said N-channel MOS transistors of said fifth pair to the sources of said P-channel MOS transistors of said second pair;
 a fourth switch configured to switch to connect said non-inversion signal of said differential input signal to one of gates of said P-channel MOS transistors of said sixth pair;
 a fifth switch configured to switch to connect said output of said operational amplifier to the other of the gates of said P-channel MOS transistors of said sixth pair; and
 a sixth switch configured to switch connections of the drains of said P-channel MOS transistors of said fifth pair to the sources of said N-channel MOS transistors of said fourth pair.

10. The operational amplifier according to claim 7, wherein said first to third switches are operated in connection to each other.

11. The operational amplifier according to claim 8, wherein said fourth to sixth switches are operated in connection to each other.

12. The operational amplifier according to claim 9, wherein said first to third switches are operated in connection to each other, and
 said fourth to sixth switches are operated in connection to each other.

13. The operational amplifier according to claim 1, wherein
 the load transistors and the bias transistors may form folded cascode connection.

14. The operational amplifier according to claim 1, wherein said switch section is driven in response to a polarity inversion signal which is switched for every horizontal period of a display.

15. An operational amplifier comprising:
 an N-channel differential pair transistors in which a differential input pair is connected to a non-inversion input terminal and an inversion input terminal connected to an output terminal;
 a P-channel differential transistor pair in which a differential input pair is connected to said non-inversion input terminal and said inversion input terminal;
 a first switch configured to switch a connection destination of each of drains of said N-channel differential pair transistors;
 a second switch configured to switch a connection destination of each of drains of said P-channel differential pair transistors;
 a first group of P-channel MOS transistors whose sources are connected to a positive power supply in common, and whose gates are connected in common and to act as an active load of folded cascode connection;

a first group of N-channel MOS transistors whose sources are connected in common to a negative power supply, and whose gates are connected in common to act as an active load of a folded cascode connection;

a second group of P-channel MOS transistors whose gates are connected in common to each other;

a second group of the N-channel MOS transistors whose gates are connected in common to each other;

a third switch connected between drains of said first group of P-channel MOS transistors and sources of said second group of P-channel MOS transistors, and configured to switch connection between drains of said first group of P-channel MOS transistors and sources of said second group of P-channel MOS transistors;

a fourth switch connected between drains of said first group of N-channel MOS transistors and sources of said second group of N-channel MOS transistors, and configured to switch connection between drains of said first group of N-channel MOS transistors and sources of said second group of N-channel MOS transistor;

a fifth switch having a common terminal connected to an input terminal and make and break terminals connected to gates of said N-channel differential pair transistors;

a sixth switch having a common terminal connected to the output terminal and make and break terminals connected to gates of said N-channel differential pair transistors;

a seventh switch having a common terminal connected to the input terminal and make and break terminals connected to gates of said P-channel differential pair transistors;

a eighth switch having a common terminal connected to the output terminal and make and break terminals connected to gates of said P-channel differential pair transistors;

a first constant current source connected between a negative power supply and sources connected in common of said N-channel differential pair transistors;

a second constant current source connected between a positive power supply with sources connected in common of said P-channel differential pair transistors;

a third constant current source as a floating current source having one end connected with a drain of one of the P-channel MOS transistors of said second group and gates of said P-channel MOS transistors of said first group in common, and the other end connected with a drain of one of said N-channel MOS transistors of said second group and gates of said N-channel MOS transistors of said first group in common;

a first constant voltage source connected between said positive power supply and gates of said P-channel MOS transistors of said second group;

a second constant voltage source connected between said negative power supply and gates of said N-channel MOS transistor of said second group; and an output buffer amplifier having input terminals connected to a drain of the other of said P-channel MOS transistors of said second group and a drain of the other of said N-channel MOS transistors of said second group.

16. The operational amplifier according to claim 15, wherein said first switch, said fifth switch and said sixth switch constitute a first switch group and operate in connection with each other.

17. The operational amplifier according to claim 15, wherein said second switch, said seventh switch and said eighth switch constitute a second switch group and operate in connection with each other.

18. The operational amplifier according to claim 1, further comprising a floating current source, wherein said load section has a folded cascode connection, and a connection in said folded cascode connection is switched without changing connection of said floating current source and said load section.

19. An operational amplifier comprising:

a differential pair section;

a load section configured to function as active load of said differential pair section;

a switch section configured to switch supply of a differential input signal to said differential pair section and to switch connection of outputs of said differential pair section to said load section driven in response to a polarity inversion signal which is switched for every horizontal period of a display; and a floating current source having a folded cascode connection, and a connection in said folded cascode connection is switched without changing connection of said floating current source and said load section.

20. The operational amplifier of claim 19, wherein the switch section is configured to cancel an offset voltage of said operation amplifier.

* * * * *